(12) United States Patent
Silva et al.

(10) Patent No.: US 11,424,720 B2
(45) Date of Patent: Aug. 23, 2022

(54) AUDIO POWER AMPLIFIER FOR REDUCED CLICK AND POP (CNP)

(71) Applicant: QUALCOMM Incorporated, San Diego, CA (US)

(72) Inventors: Pradeep Silva, San Diego, CA (US); Ramkumar Sivakumar, San Diego, CA (US); Qubo Zhou, San Diego, CA (US); Xinwang Zhang, San Diego, CA (US); Hanil Lee, San Diego, CA (US); Dongyang Tang, San Diego, CA (US); Vijayakumar Dhanasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 110 days.

(21) Appl. No.: 16/827,280

(22) Filed: Mar. 23, 2020

(65) Prior Publication Data

US 2021/0297046 A1    Sep. 23, 2021

(51) Int. Cl.
*H03F 1/02* (2006.01)
*H03F 3/21* (2006.01)
*H04B 1/40* (2015.01)

(52) U.S. Cl.
CPC .......... *H03F 1/0288* (2013.01); *H03F 3/211* (2013.01); *H03F 2200/03* (2013.01); *H04B 1/40* (2013.01)

(58) Field of Classification Search
CPC .... H03F 1/0288; H03F 3/211; H03F 2200/03; H04B 1/40

USPC ........................................................ 330/295
See application file for complete search history.

(56) References Cited

U.S. PATENT DOCUMENTS

| 9,641,128 | B2 | 5/2017 | Yang et al. |
| 2015/0237438 | A1* | 8/2015 | Lee ........................ H03G 3/348 381/74 |
| 2017/0033744 | A1* | 2/2017 | Yang ........................ H03F 3/72 |
| 2017/0054416 | A1* | 2/2017 | Zhu ..................... H03F 3/45475 |

OTHER PUBLICATIONS

Chen et al., "A 62mW Stereo Class-G Headphone Driver with 108dB Dynamic Range and 600 μA/Channel Quiescent Current", 2013 IEEE International Solid-State Circuits Conference, pp. 181-184. (Year: 2013).*
International Search Report and Written Opinion—PCT/US2021/023647—ISA/EPO—dated Jul. 23, 2021.

* cited by examiner

*Primary Examiner* — Hafizur Rahman
(74) *Attorney, Agent, or Firm* — Seyfarth Shaw LLP

(57) ABSTRACT

A power amplifier provides reduction of click and pop in audio applications. The power amplifier includes a first amplifier and an auxiliary amplifier. The auxiliary amplifier is used to ramp the power amplifier output from ground to an offset voltage to reduce the "click and pop" sound. The first amplifier and the auxiliary amplifier having a shared feedback loop. An output of the first amplifier and an output of the auxiliary amplifier may be switchably coupled to the shared feedback loop. A wave generator controls a switch to couple the first amplifier output or the auxiliary amplifier output to the shared feedback loop.

14 Claims, 11 Drawing Sheets

AUDIO POWER AMPLIFIER FOR REDUCED CLICK AND POP (CNP)

TECHNICAL FIELD

The present disclosure generally relates to power amplifiers. More specifically, the present disclosure relates to audio power amplifiers for reducing click and pop at the amplifier output.

BACKGROUND

Electronic devices such as multimedia devices are very popular. The multimedia devices may be used to deliver audio and/or video entertainment experience to millions or users around the world. Devices such as wireless mobile phones may be used for wireless communications as well as for audio, video and gaming. In noisy environments or when a user desires to not have others hear the multimedia output being received (the statements made by others on a phone call, or explicit lyrics in a song being played) or other reasons, a user may opt to use headphones.

Wireless or mobile communications devices and other multimedia devices include power amplifier to amplify an input radio frequency (RF) signal to a desired level for communications and/or multimedia playback. When the headphones are connected to the mobile communications or other multimedia device whether via line in, or wireless ear piece unwanted audio artifacts such as audible popping or clicking sounds may be output as the headphone device powers up or down.

In headphone (HPH) power amplifier design, it is helpful to reduce or mitigate clicks and pops as the power amplifier is turned on and off. The root cause for the clicks is due to a voltage transition from ground to the power amplifier output offset voltage. An auxiliary amplifier may be used to reduce the voltage transition. However, an offset mismatch between main path and auxiliary path resistors can lead to comparatively large offsets because there is a common mode current flowing through each of these paths. This results in two different direct current (DC) offsets, one for each of the auxiliary paths in the main path. When switching between these two paths, an audible click sound is produced at the output. The audible click and popping sound frustrates users and degrades the user entertainment experience and in some cases may cause some user discomfort.

SUMMARY

In an aspect of the present disclosure, a power amplifier is provided. The power amplifier includes a first amplifier and an auxiliary amplifier. The auxiliary amplifier ramps the power amplifier output from ground to an offset voltage to reduce the "click and pop" sound. The first amplifier and the auxiliary amplifier have a shared feedback loop.

In another aspect of the present disclosure, a method of power amplification is disclosed. The method includes switchably coupling a first amplifier of a power amplifier or an auxiliary amplifier of the power amplifier to a shared feedback loop. The method also includes ramping an output of the power amplifier from ground to an offset voltage to reduce an audible click and pop sound.

In yet another aspect, a power amplifier has means for switchably coupling a first amplifier of the power amplifier or an auxiliary amplifier of the power amplifier to a shared feedback loop. The power amplifier also has means for ramping an output of the power amplifier from ground to an offset voltage to reduce a pop and/or click.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR," and the use of the term "or" is intended to represent an "exclusive OR."

A wireless communications device, such as a user equipment (UE), may include transmit chains that are composed of multiple radio frequency (RF) transmitters, multiple power amplifiers, multiple antennas, and one or more front end (FE) devices through which signals are transmitted from the UE. The transmit chains of the UE, however, may include a class of power amplifiers that are designed for meeting a power level specified for a current device generation.

The UE may be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology.

Aspects of the present disclosure are directed to a power amplifier having a main amplifier and an auxiliary amplifier with a common resistor feedback (RFB) for the main and auxiliary loops. The signal path, when the main amplifier is in an on state, is configured such that there are no switches in the path to the output. Accordingly, the resistor mismatch encountered when handing off between the main and auxiliary loops may be reduced, and in some aspects, eliminated. In doing so, a click and/or pop sound emitted as a result of such a resistor mismatch may be reduced to a level that is near or below an inaudible range for human beings (e.g., <100 µV or −80 dB).

Figure 1:
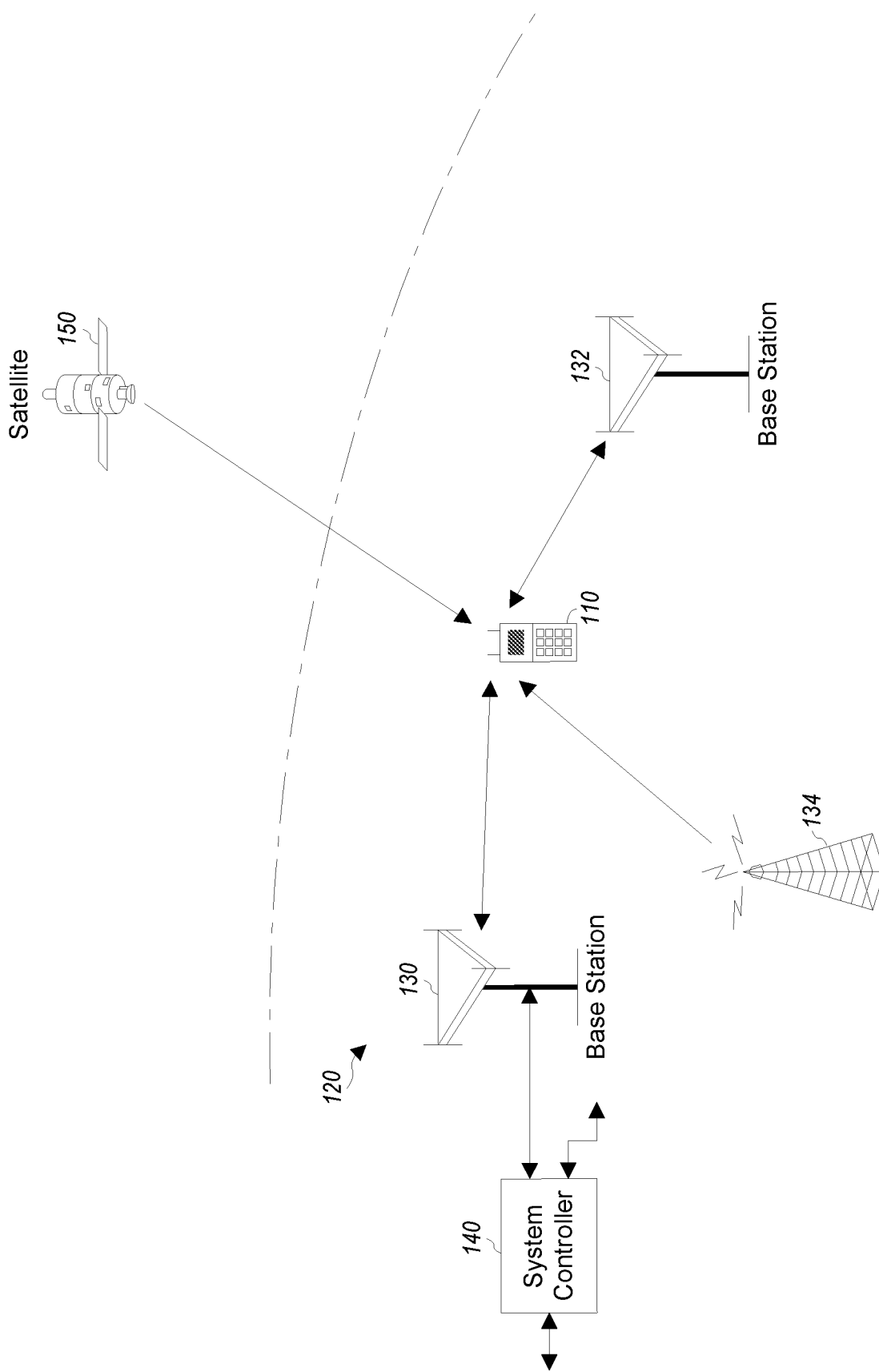
FIG. 1 shows a wireless device communicating with a wireless communications system.

FIG. 1 shows a wireless device 110 communicating with a wireless communications system 120. The wireless device 110 includes the multi-level (e.g., tri-level) power supply architecture for radio frequency power amplifiers and avails itself of the advantages of the multi-level power supply architecture. The wireless communications system 120 may be a 5 G system, a long term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). For simplicity, FIG. 1 shows the wireless communications system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth® device, etc. The wireless device 110 may be capable of communicating with the wireless communications system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communications such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five carriers in one or two bands in LTE Release 11.

Figure 2:
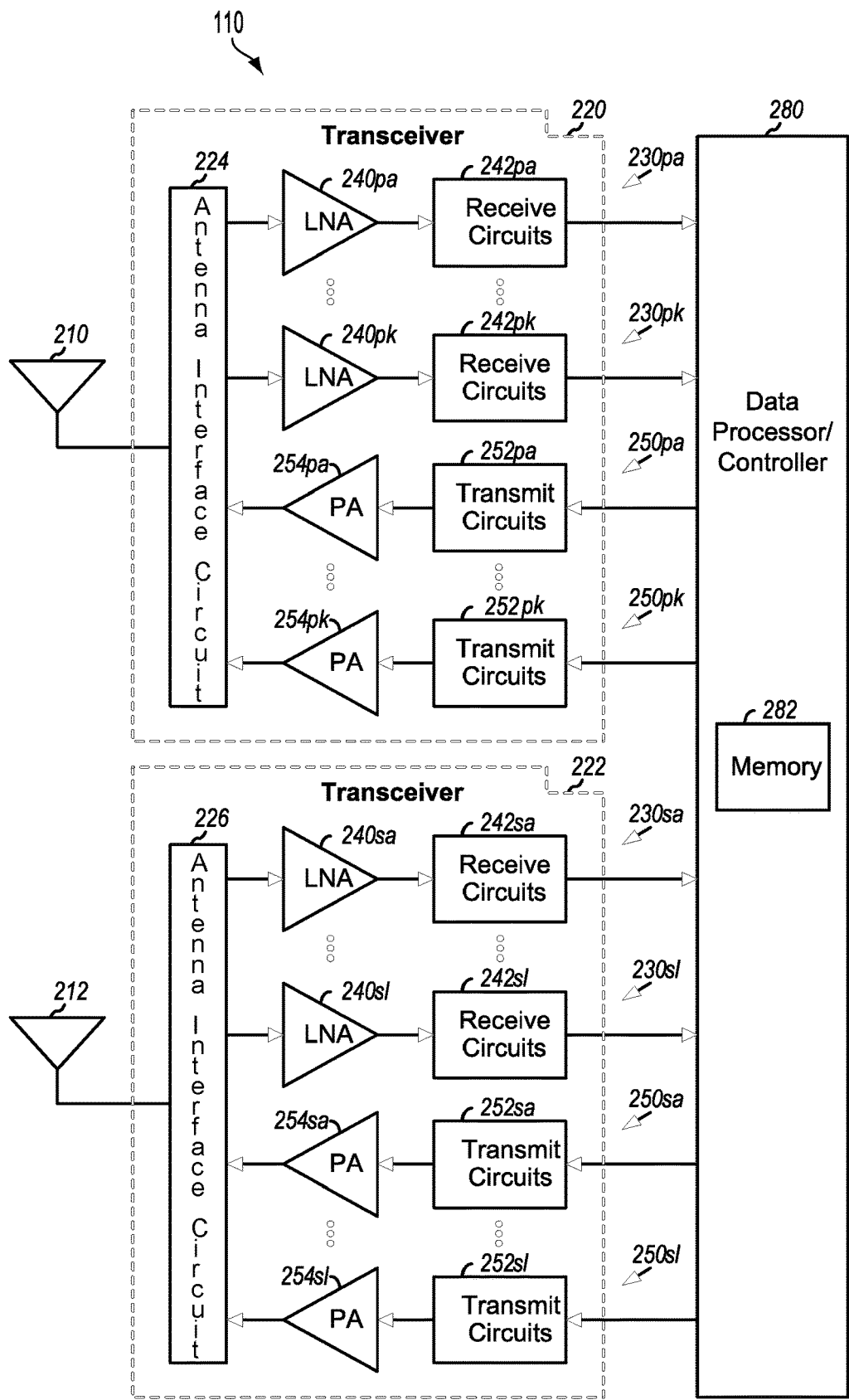
FIG. 2 shows a block diagram of the wireless device in FIG. 1, according to an aspect of the present disclosure.

FIG. 2 shows a block diagram of an exemplary design of the wireless device 110 in FIG. 1. In this exemplary design, the wireless device 110 includes a transceiver 220 coupled to a primary antenna 210, a transceiver 222 coupled to a secondary antenna 212 via antenna interface circuit 226, and also coupled to a data processor/controller 280. The transceiver 220 includes multiple (K) receivers 230*pa* to 230*pk* and multiple (K) transmitters 250*pa* to 250*pk* to support multiple frequency bands, multiple radio technologies, carrier aggregation, etc. The transceiver 222 includes L receivers 230*sa* to 230*sl* and L transmitters 250*sa* to 250*sl* to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes a low noise amplifier (LNA) 240 and receive circuits 242. For data reception, the antenna 210 receives signals from base stations and/or other transmitter stations and provides a received radio frequency (RF) signal, which is routed through an antenna interface circuit 224 and presented as an input RF signal to a selected receiver 230. An antenna interface circuit 224 may include switches, duplexers, transmit filters, receive filters, matching circuits, etc. The description below assumes that the receiver 230*pa* is the selected receiver. Within the receiver 230*pa*, an LNA 240*pa* amplifies the input RF signal and provides an output RF signal. Receive circuits 242*pa* downconvert the output RF signal from RF to baseband, amplify and filter the downconverted signal, and provide an analog input signal to data processor 280. Receive circuits 242*pa* may include mixers, filters, amplifiers, matching circuits, an oscillator, a local oscillator (LO) generator, a phase locked loop (PLL), etc. Each remaining receiver 230 in the transceivers 220 and 222 may operate in a similar manner as the receiver 230*pa*.

In the exemplary design shown in FIG. 2, each transmitter 250 includes transmit circuits 252 and a power amplifier (PA) 254. For example, the tri-level power supply architecture modulates the power supply to the power amplifier 254. For data transmission, a data processor 280 processes (e.g., encodes and modulates) data to be transmitted and provides an analog output signal to a selected transmitter. The description below assumes that the transmitter 250*pa* is the selected transmitter. Within the transmitter 250*pa*, transmit circuits 252*pa* amplify, filter, and upconvert the analog output signal from baseband to RF and provide a modulated RF signal. The transmit circuits 252*pa* may include amplifiers, filters, mixers, matching circuits, an oscillator, an LO generator, a PLL, etc. A power amplifier (PA) 254*pa* receives and amplifies the modulated RF signal and provides a transmit RF signal having the proper output power level.

The transmit RF signal is routed through the antenna interface circuit 224 and transmitted via the antenna 210. Each remaining transmitter 250 in the transceivers 220 and 222 may operate in a similar manner as the transmitter 250pa.

FIG. 2 shows an exemplary design of a receiver 230 and transmitter 250. The receiver 230 and transmitter 250 may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple ICs, as described below. The circuits in transceivers 220 and 222 may also be implemented in other manners.

The data processor/controller 280 may perform various functions for the wireless device 110. For example, the data processor 280 may perform processing for data being received via the receivers 230 and data being transmitted via the transmitters 250. The controller 280 may control the operation of the various circuits within the transceivers 220 and 222. In some aspects, the transceivers 220 and 222 may also comprise a controller to control various circuits within the respective transceiver (e.g., LNAs 240). A memory 282 may store program codes and data for the data processor/controller 280. The data processor/controller 280 may be implemented on one or more application specific integrated circuits (ASICs) and/or other ICs.

Figure 3:
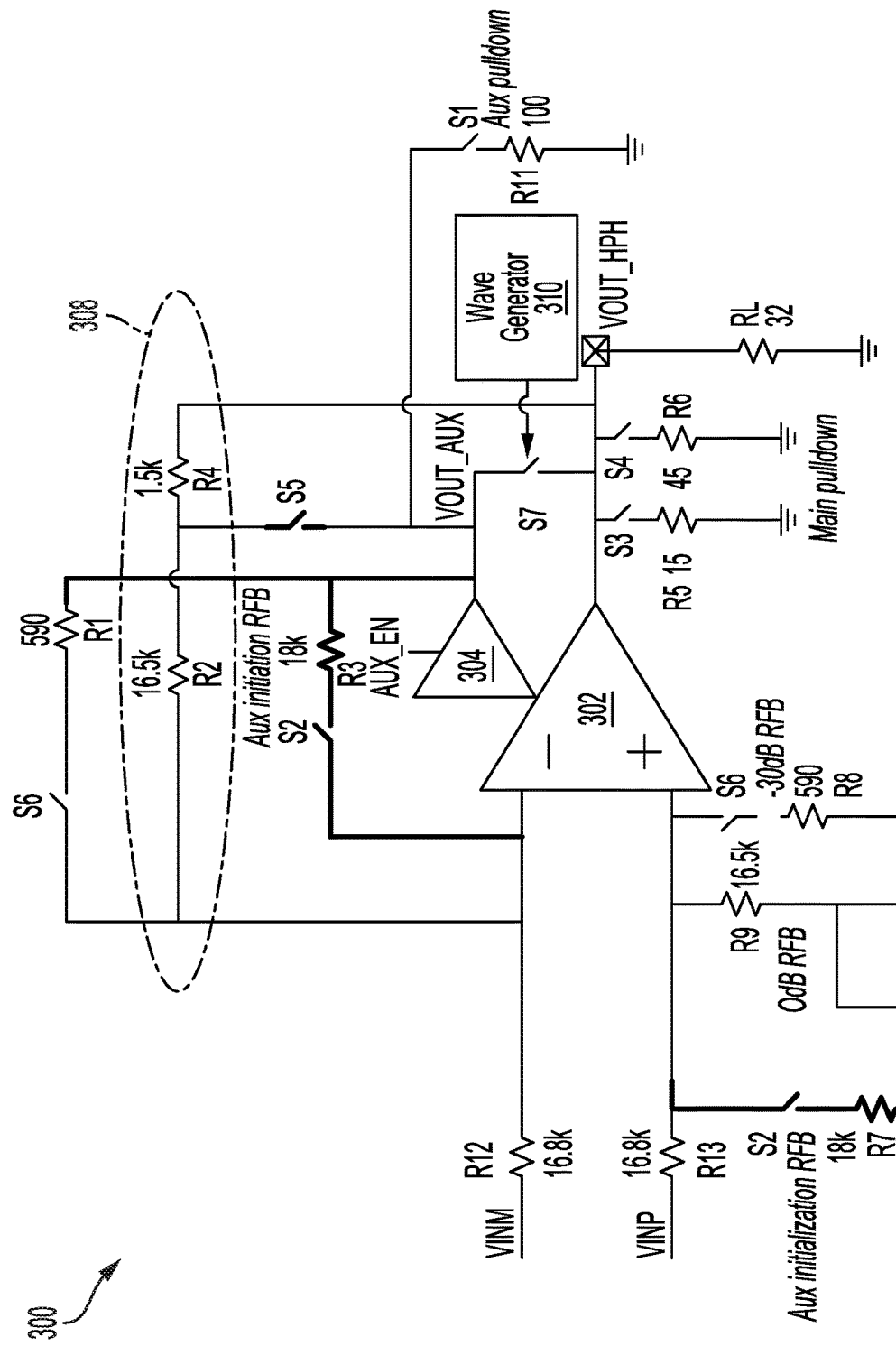
FIG. 3 illustrates a power amplifier in accordance with aspects of the present disclosure.

FIG. 3 illustrates a power amplifier 300 in accordance with aspects of the present disclosure. The power amplifier (PA) 300 is configured to reduce, and in some cases mitigate, a click sound or pop sound as the PA 300 is turned on and/or off. The click/pop sound is believed to occur due to a voltage transition from ground to a PA output offset voltage.

Referring to FIG. 3, the PA 300 includes a main PA 302, an auxiliary PA 304, and a wave generator 310. An input stage of the main PA 302 and the auxiliary PA 304 may be shared. Accordingly, an intrinsic offset of the main PA 302 and the auxiliary PA may be equal or approximately equal. The output stage of the main PA 302 and auxiliary PA 304 as shown in FIG. 3 may be distinct. However, a dominant contribution to intrinsic amplifier offset is the input stage, thus the offsets of main PA 302 and auxiliary PA 304 may be equal.

The PA 300 also includes a set of switches s1-s7, which may be controlled to configure the PA 300 to utilize the main PA 302 or the auxiliary PA 304. Furthermore, the switches s1-s7 may be controlled (e.g., via the wave generator 310) to configure the PA 300 to include one or more resistors (e.g., R1-R11 and RL) to reduce the resistor dependent differing mismatch such as, for example, when handing off from a configuration in which the auxiliary PA 304 is active to a configuration in which the main PA 302 is active. In some aspects, switch s7 may be controlled via the wave generator 310 while the other switches (e.g., s1-s6) may be controlled via a separate digital controller (e.g., data processor/controller 280), where the sequence of how the switches are driven may be encoded into the controller design. Each of the resistors R1-R11 and RL are respectively shown as having a specific resistance value. However, the specified resistance values in FIG. 3 and throughout the present disclosure are merely exemplary and for ease of understanding, and one of ordinary skill in the art will appreciate that other values could likewise be used for reasons related to design preference, for instance. Additionally, R12 and R13 are shown in FIG. 3 as being included in the PA 300. However R12 and R13 may comprise effective resistance values, for example, of an input (e.g., digital-to-analog converter). The main PA 302 receives an input voltage (Vin) that may be supplied via a digital-to-analog converter (DAC), for example.

The main PA 302 and the auxiliary PA 304 have a common or shared resistor feedback 308 coupled between an inverting terminal of the main PA 302 and an output for the main PA 302. The common resistor feedback 308 comprises resistors (e.g., R2 and R4) that are included in the feedback path or loop when the auxiliary PA 304 is active or when the main PA 302 is active. When the auxiliary PA 304 is active, switch s5 may be controlled to be closed to provide a tap into the resistor feedback of the main PA 302 (e.g., R2 and R4). The resistance along an m path (e.g., R2 and R4) and the resistance along a p path (e.g., R9 and R10) may be matched. Additionally, the PA 300 may be operated without including switches in the main PA 302 feedback path (e.g., from the main PA output (Vout) across resistors R2 and R4 to the inverting input of the main PA 302).

Figure 4A:
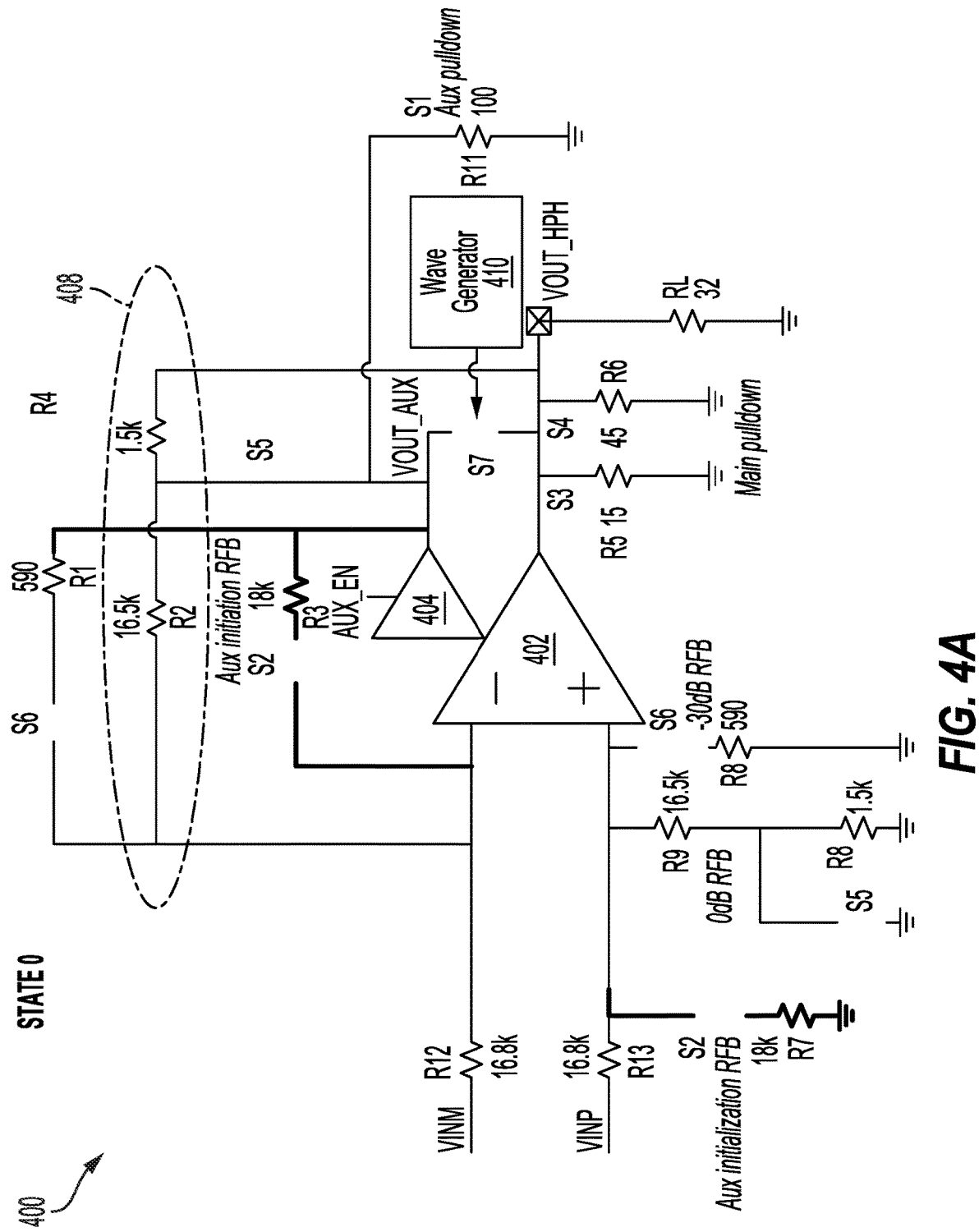
FIGS. 4A-4E illustrate the power amplifier at various states of operation in accordance with aspects of the present disclosure.

FIGS. 4A-4D illustrate a power amplifier (PA) 400 at various states of operation in accordance with aspects of the present disclosure. The PA 400 has a configuration similar to the PA 300 and includes features described above with respect to FIG. 3. Referring to FIG. 4A, the PA 400 is shown in state 0. In state 0, the input (e.g., a DAC) may be turned on to drive the PA 400. Switch s7 is controlled via a wave generator 410 to be open. Switches s2 and s6 are also controlled to be open, while switches s3-s5 are controlled to be closed. By closing switch s5, the auxiliary output taps are coupled to a shared resistor feedback 408. A main PA 402 and an auxiliary PA 404 are disabled and thus, in state 0 neither is driving an output. Additionally, the outputs of the main PA 402 and auxiliary PA 404 are pulled down via the main pulldown resistors (e.g., R5 and R6) coupled to the output of the main PA 402 and the auxiliary pulldown R11. In operation, the input voltage Vin starts to ramp from 0 to 1.5V, for example. However, the input voltage (Vin) is attenuated by the pulldown resistors (e.g., R5, R6, R11), thereby reducing, and in some aspects, eliminating the output of an audible click or pop.

Figure 4B:
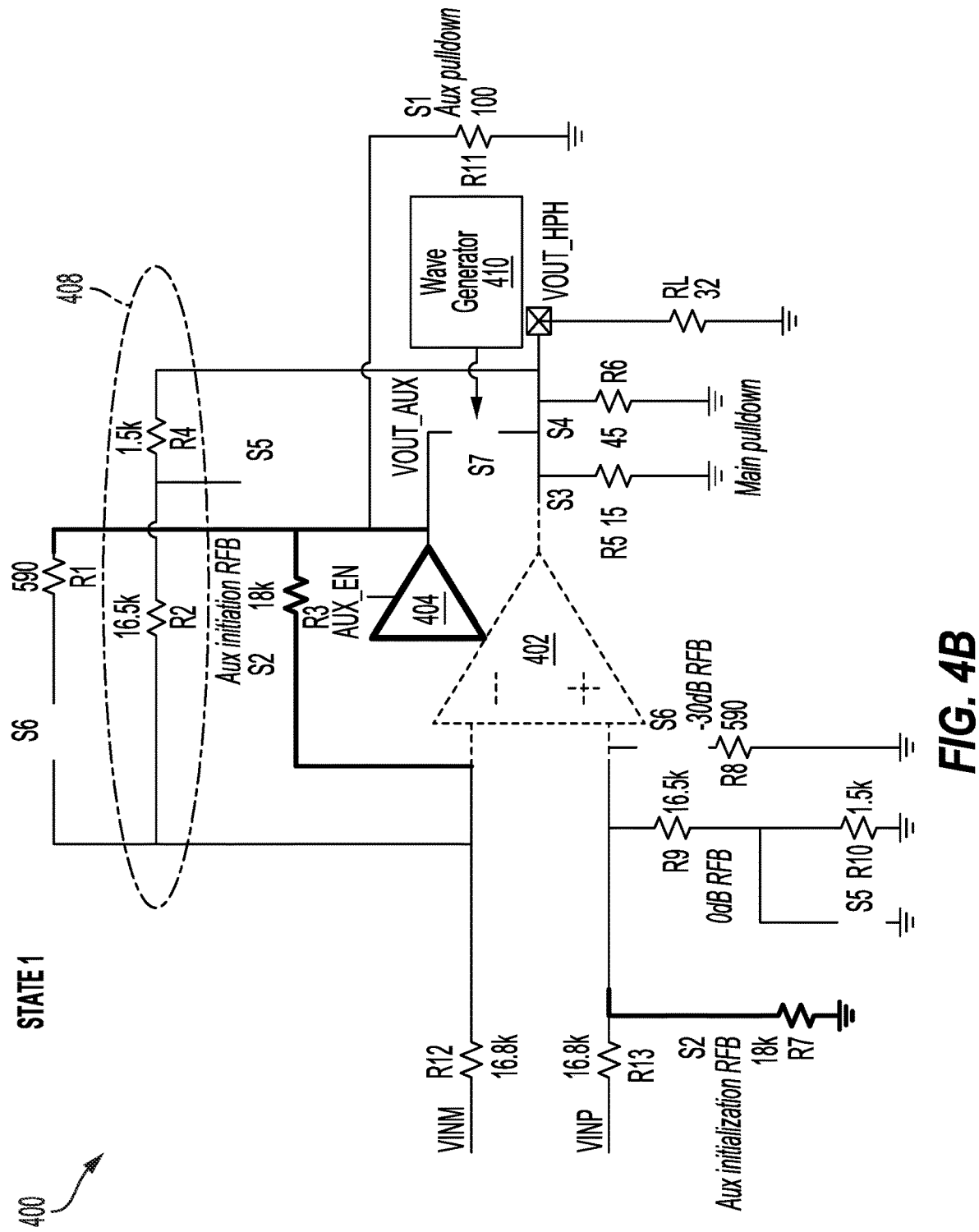

FIG. 4B illustrates the PA 400 in state 1 of operation, in accordance with aspects of the present disclosure. In state 1, CnP switch s7 and switches s5 and s6 remain open. The main PA 402 remains off and the auxiliary PA 404 is turned on via enable signal (AUX_EN). The auxiliary loop settles to an offset voltage (Vout_Aux). However, because the auxiliary loop is being powered up, there may be a large transient at the auxiliary PA output. The main loop may receive the transient at the virtual ground, attenuated by a (RL∥R5∥R6)/18K resistor divider (e.g., attenuated by approximately 60 dB). Since the main PA 302 is not on, the p and m sides do not have to match. On the m side, by having S5 closed and the aux pulldown S1 of 100 ohms on, this provides further attenuation at the VOUT_HPH terminal while the input (e.g. a DAC) is switched on. Again, while various resistance values have been provided for ease of understanding, the present disclosure is not so limiting, and different resistance values could also be used.

Figure 4C:
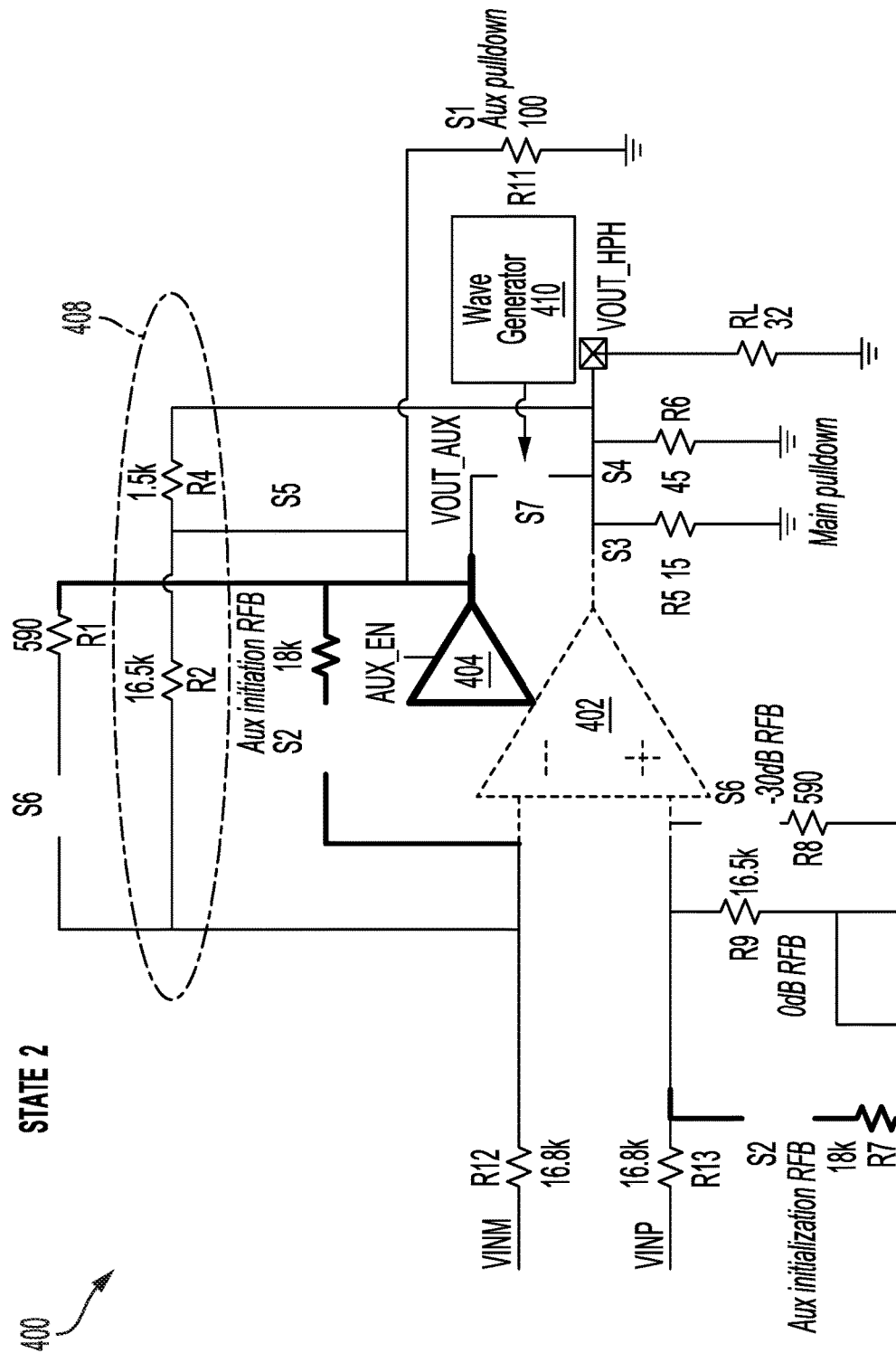

FIG. 4C illustrates the PA 400 in state 2 of operation in accordance with aspects of the present disclosure. In state 2, switch S5 is closed, such that the auxiliary loop taps into the main resistor feedback. As such, the same feedback components (e.g., R4) are used in the auxiliary loop as when switching back to the main feedback loop. The output of the auxiliary PA 404 is supplied to resistor R4 and to the output of the PA 400 (VOUT_HPH). However, the output is attenuated via the main pulldown resistors and the load resistance RL (e.g., headphones, ear piece, line out, etc.). Thus, a mismatch in resistance between the main loop and the auxiliary loop may be reduced, and in some aspects avoided.

Figure 4D:
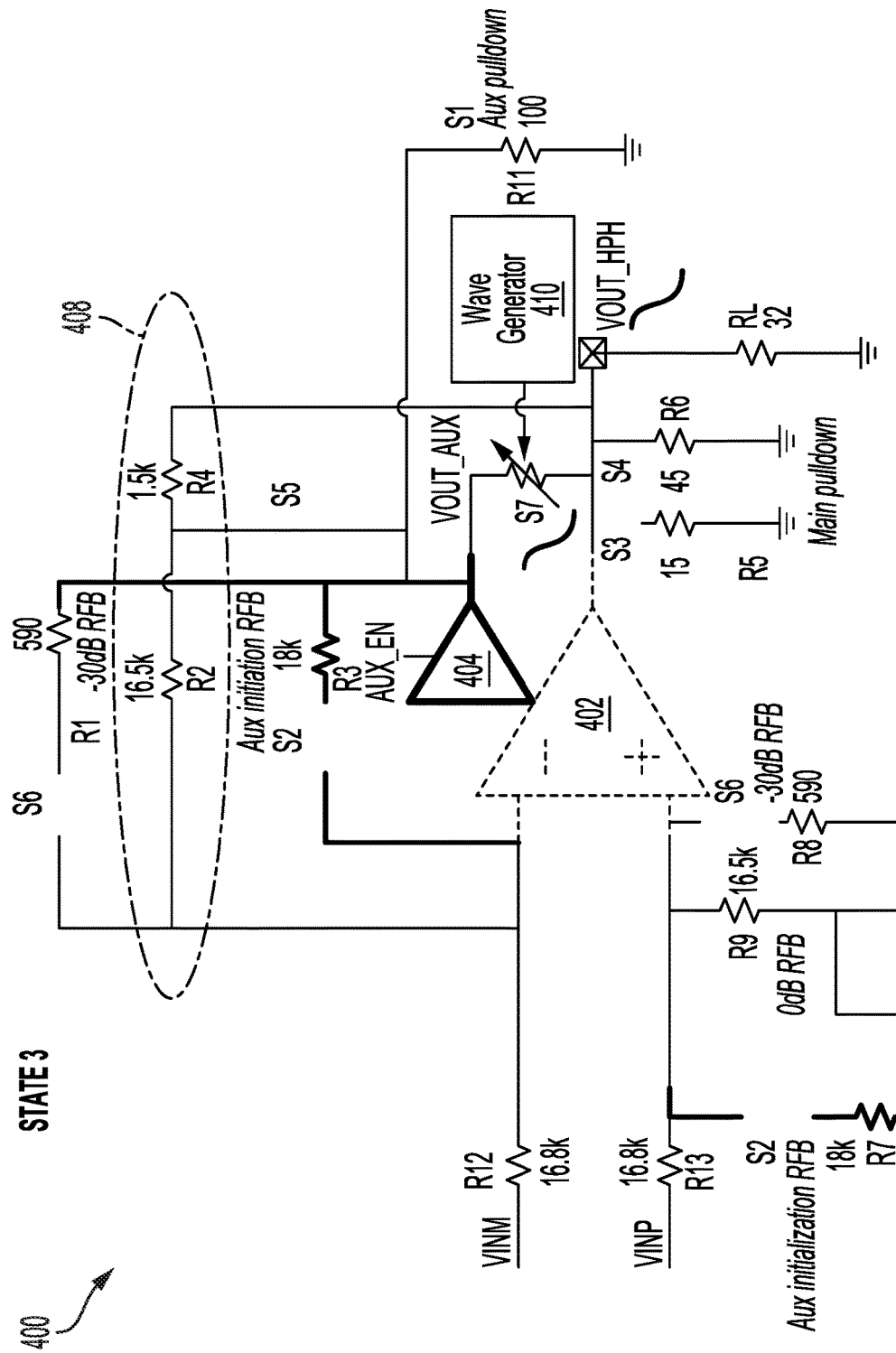

FIG. 4D illustrates the PA 400 in state 3 of operation in accordance with aspects of the present disclosure. In state 3, switch S7 is closed and the resistance of switch S7 is ramped down such that the output offset from the auxiliary PA 404 may be ramped down by the resistance of switch s7. That is, the wave generator 410 ramps down the click and pop (CnP) switch resistance (e.g., s7) under the control of the wave generator 410. Thus, the auxiliary PA 404 output may be transferred to the PA 400 output (VOUT_HPH). That is, the PA 400 output ramps up to the offset voltage. The final value of the voltage depends on the resistor divider between the CnP switch S7 and the load resistance RL (e.g., 32 ohms) load.

Figure 4E:
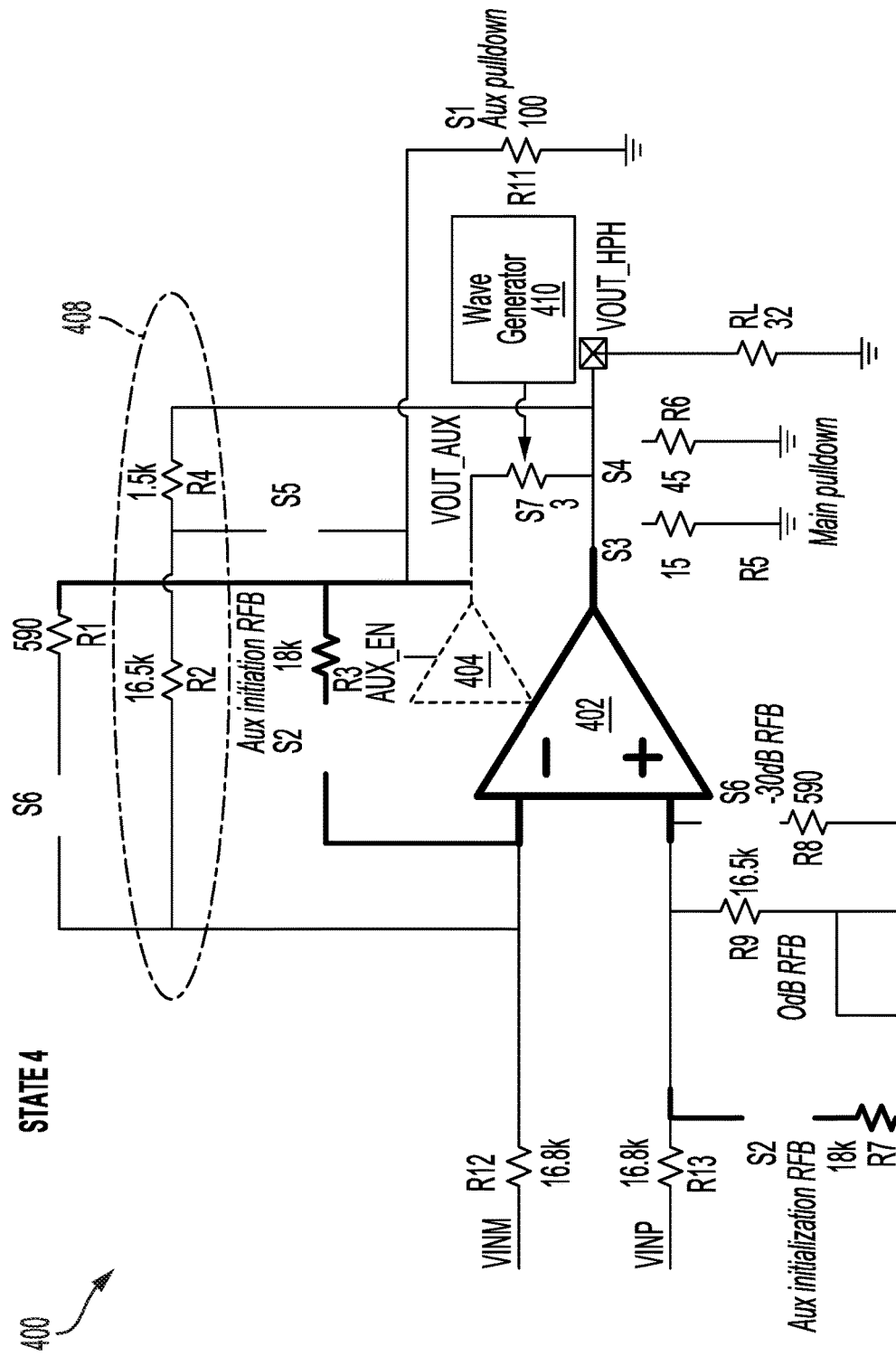

FIG. 4E illustrates the PA 400 in state 4 of operation, in accordance with aspects of the present disclosure. In state 4, the auxiliary PA 404 is turned off, and switch S5 is opened to remove the tap between the output of the auxiliary PA 404 and the main resistor feedback. Furthermore, the main PA 402 is turned on.

Figure 5A:
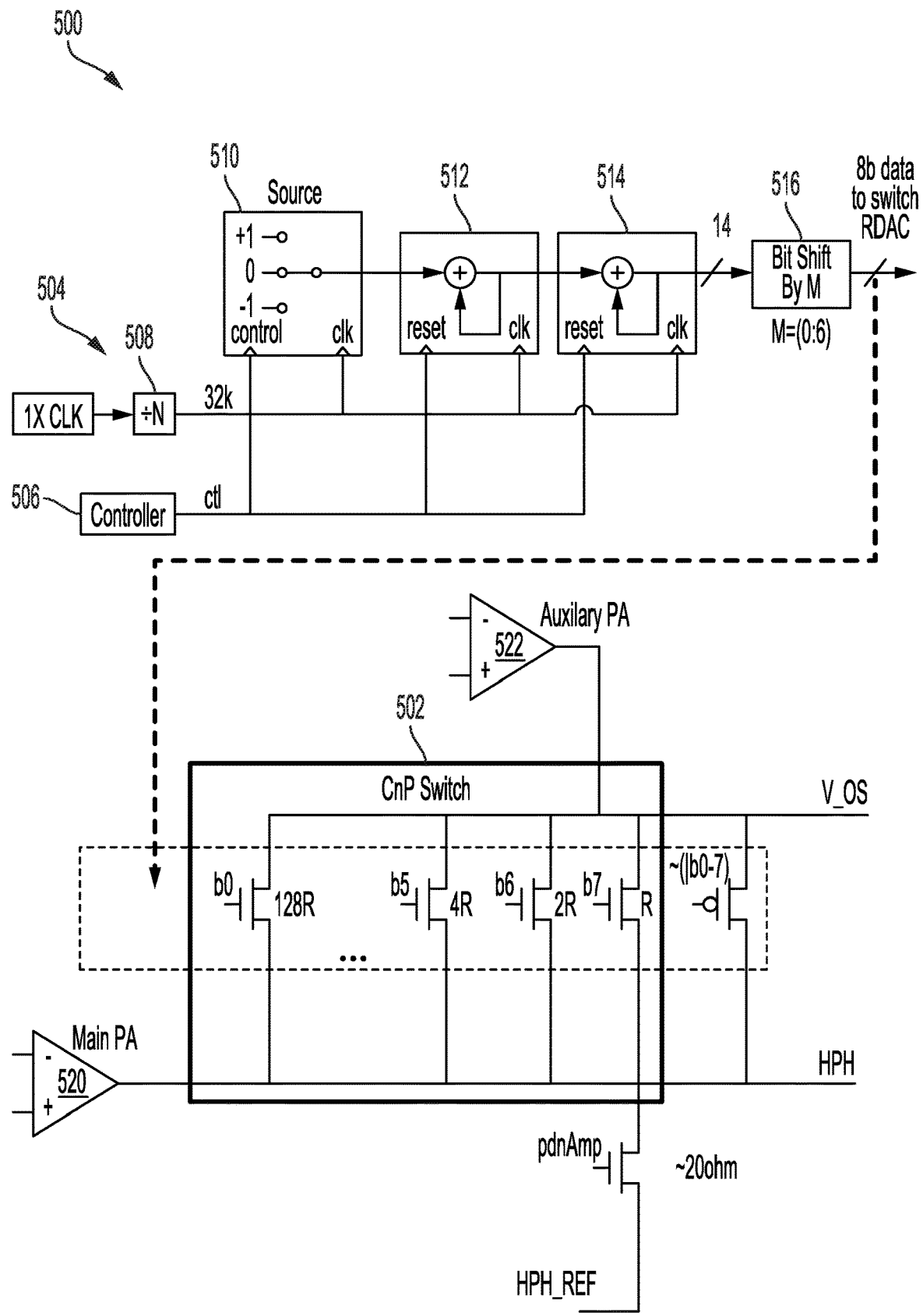
FIG. 5A illustrates a digital wave generator in accordance with aspects of the present disclosure.

FIG. 5A illustrates a digital wave generator 500, in accordance with aspects of the present disclosure. The digital wave generator 500 includes a click and pop (CnP) switch 502 and a digital controller 504. The digital controller 504 includes a main controller 506, a clock divider 508, a source 510, an eight-bit shift register 516, a first integrator 512, and a second integrator 514. The first integrator 512 is coupled to the second integrator 514 in cascade.

The digital controller 504 receives an input clock signal CLK, which is supplied to the clock divider 508 and distributed to the source 510, the first integrator 512, and the second integrator 514. In some aspects, the digital controller 504 may run on a 32 kHz clock, for example.

Under the control of the main controller 506, the source 510 may be configured to output +1, 0, or −1, such that the first integrator 512 may output a wave having a slope that is +1, 0, or −1. The second integrator 514 integrates the output of the first integrator 512. The output of the second integrator 514 is supplied to the eight-bit shift register 516. By controlling the output of the source 510 and the cascaded integrators (e.g., 512, 514), the digital controller 504 is programmable to vary the shape of the waveforms used to drive the CnP switch 502.

The CnP switch 502 may be coupled between the output of a main power amplifier 520 and the output of an auxiliary power amplifier 522. The CnP switch 502 may include multiple internal switches (e.g., b0-b7). The resistance of the CnP switch 502 may be a weighted combination of the internal switches (e.g., b0-b7), such that the CnP switch 502 is configured as a binary-weighted switch. In some aspects, the CnP switch 502 may be an 8-bit binary-weighted switch. However, such switch configuration and/or the number of bits is merely exemplary and the CnP switch 502 may in some aspects, be configured with more or less bits or as a thermometer-coded switch, for instance.

Using the cascaded integrators (e.g., 512 and 514), the digital controller 504 may be operated to produce a second order s-shaped wave that may be used to drive the CnP switch 502.

Accordingly, in some aspects, the digital wave generator 500 may have a ramp time that is independent of process, voltage, and temperature. Additionally, the digital wave generator 500 may be configured to have a smaller footprint in comparison to analog wave generators. By way of example only, the digital wave generator 500 may be configured to have a size that is 10% of the size of an analog wave generator in 150 nm.

Figure 5B:
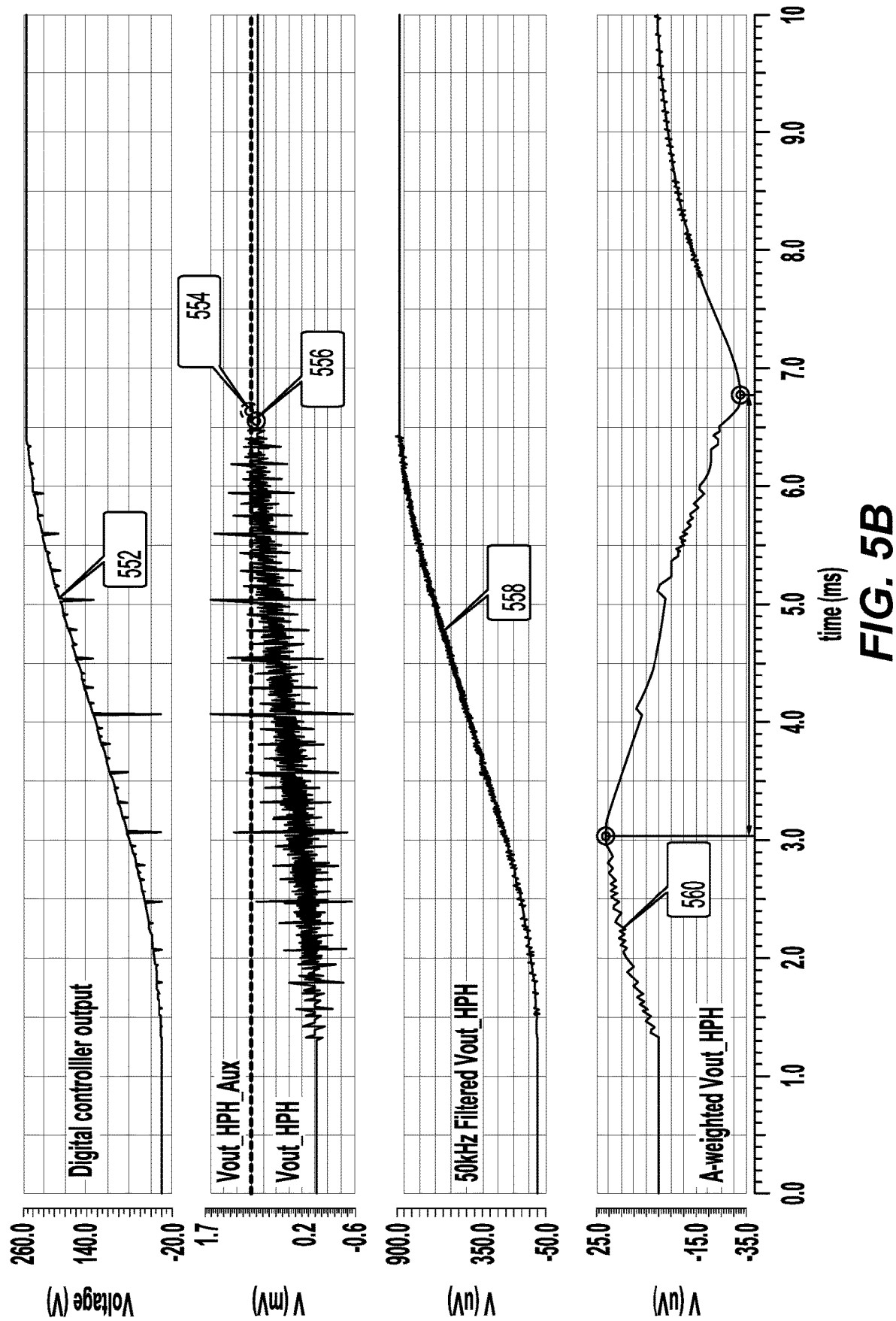
FIG. 5B is a diagram illustrating example waveforms generated digital wave generator and a power amplifier in accordance with aspects of the present disclosure.

FIG. 5B is a diagram illustrating example waveforms generated by the digital wave generator and a power amplifier in accordance with aspects of the present disclosure. Referring to FIG. 5B, a waveform 552 represents the output of a digital controller (e.g., 504) of a digital wave generator (e.g., 500). Waveform 554 represents an output of an auxiliary PA (e.g., 404) and waveform 556 represents an output of a main PA (e.g., 402). Additionally, waveforms 558 and 560, respectively, represent a filtered output of the main PA (e.g., 402) and an A-weighted output of the main PA (e.g., 402). In this exemplary aspect, the digital controller (e.g., 504) may be operated to generate waveform 552 which is an s-shaped waveform. Applying the s-shaped waveform (552) output of the digital controller (e.g., 504) to control a CnP switch (e.g., s7), to close such that the output of the main amplifier gradually ramps up (see e.g., waveforms 556 and 558). In doing so, an electronic device (e.g., a smartphone) configured with a power amplifier (e.g., 400) may be operated without the nuisance of an audible click or pop sound.

Figure 6:
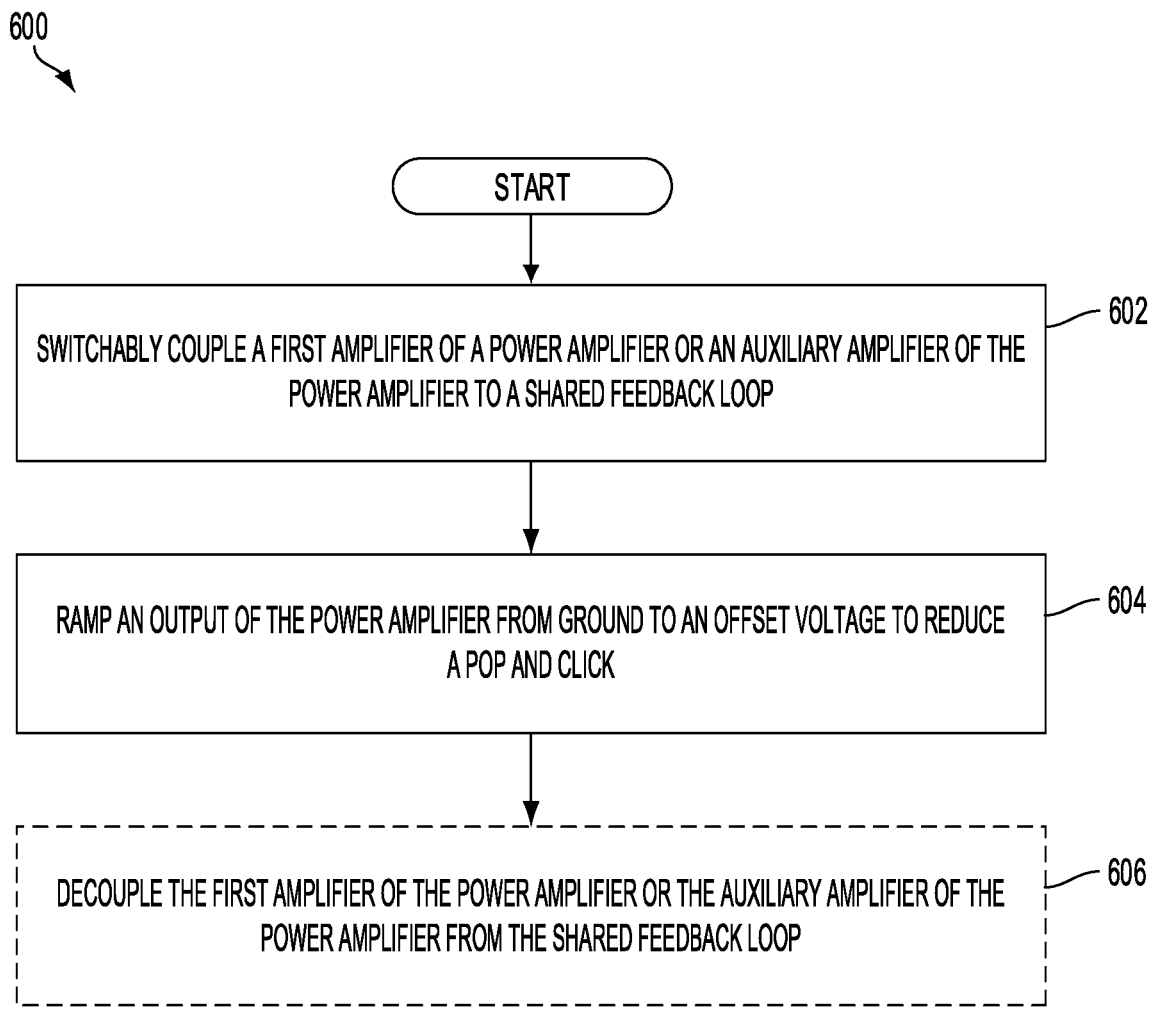
FIG. 6 depicts a simplified flowchart of a method of power amplification in accordance with aspects of the present disclosure.

FIG. 6 depicts a simplified flowchart of a method 600 of power amplification in accordance with aspects of the present disclosure. At block 602, a first amplifier of a power amplifier or an auxiliary amplifier of the power amplifier is switchably coupled to a shared feedback loop. In some aspects, the first amplifier of the power amplifier or the auxiliary amplifier of the power amplifier may be coupled to the shared feedback loop via a switch. For example, as shown in FIG. 3, the main PA 302 may be coupled to the shared feedback 308 via switch s7 and the auxiliary PA 304 may be coupled to the shared feedback 308 via switch s5. In some aspects, the switches (e.g., s7) may each comprise a binary-weighted switch. For instance as shown in FIG. 5, the CnP switch 502 includes multiple internal switches (e.g., b0-b7). The resistance of the CnP switch 502 may be a weighted combination of the internal switches (e.g., b0-b7), such that the CnP switch 502 is configured as a binary-weighted switch. In some aspects, the CnP switch 502 may be an 8-bit binary-weighted switch.

Switch s7 may be operated under control of the wave generator 310. In some aspects, the wave generator 310 may comprise an analog wave generator or a digital wave generator. For example, in FIG. 5, the digital wave generator 500 is shown. The digital wave generator 500 includes the digital controller 504 and cascaded integrators (e.g., 512 and 514). The digital controller 504 may be operated to produce a second order s-shaped wave that may drive the CnP switch 502, for example.

At block 604, an output of the power amplifier is ramped from ground to an offset voltage to reduce a pop and click sound. For instance, as shown in FIG. 4D, the PA 400 is in a state 3 of operation. In state 3, switch s7 is closed and the resistance of switch s7 is ramped down such that the output offset from the auxiliary PA 404 may ramp down the resistance of switch s7. That is, the wave generator 410 ramps down the click and pop switch resistance (e.g., s7) under the control of the wave generator 410. Thus, the auxiliary PA 404 output may be transferred to the PA 400 output (VOUT_HPH). That is, the PA 400 output is ramped up to the offset voltage. In doing so, a pop and click sound resulting from resistance mismatch when transitioning between the feedback loop for the auxiliary PA (e.g., 404) and feedback loop for main PA (e.g., 402) may be reduced and in some aspects, eliminated. In doing so, a click and/or pop sound that may be emitted as a result of such a resistor mismatch may be reduced to a level that is near or below an inaudible range for human beings (e.g., −80 dB).

At block 606, method 600 may optionally decouple the first amplifier of the power amplifier or the auxiliary amplifier of the power amplifier from the shared feedback loop. For example, in FIG. 4E, the PA 400 is in state 4. In state 4, the auxiliary PA 404 is turned off, and switch S5 is opened to remove the tap between the output of the auxiliary PA 404 and the main resistor feedback.

According to one aspect of the present disclosure, a power amplifier is described. The power amplifier includes means for switchably coupling a first amplifier of a power amplifier or an auxiliary amplifier of the power amplifier to a shared feedback loop. The power amplifier also includes means for ramping an output of the power amplifier from ground to an offset voltage to reduce a pop and click. The means for switchably coupling may, for example, be the switch s7, the wave generator 310, the CnP switch 502, and the digital controller 504. The means for ramping may, for example, be the auxiliary power amplifier 304, the switch s7, the wave generator 310, the CnP switch 502 and the digital controller 504. In another aspect of the present disclosure, the aforementioned means may be any module or any apparatus or material configured to perform the functions recited by the aforementioned means.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, include compact disc (CD), laser disc, optical disc, digital versatile disc (DVD), floppy disk, and Blu-ray disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A power amplifier comprising:
   a first amplifier; and
   an auxiliary amplifier, the first amplifier and the auxiliary amplifier having a shared feedback loop, a first resistance along a first signal path for the first amplifier matching a second resistance along a second signal path for the auxiliary amplifier.

2. The power amplifier of claim 1, in which the auxiliary amplifier is configured to ramp a power amplifier output from ground to an offset voltage to reduce a pop and/or click.

3. The power amplifier of claim 1, further comprising a switch coupled between the auxiliary amplifier and a power amplifier output.

4. The power amplifier of claim 3, further comprising a wave generator configured to control operation of the switch.

5. The power amplifier of claim 4, in which the wave generator is a digital wave generator and comprises:
   a digital controller; and
   a binary-weighted switch, the digital controller configured to produce a second order S-shaped wave to control the binary-weighted switch.

6. A method of power amplification, comprising:
   switchably coupling a first amplifier of a power amplifier or an auxiliary amplifier of the power amplifier to a shared feedback loop, a first resistance along a first signal path for the first amplifier matching a second resistance along a second signal path for the auxiliary amplifier; and ramping an output of the power amplifier from ground to an offset voltage to reduce a pop and/or click.

7. The method of claim 6, further comprising decoupling the first amplifier of the power amplifier or the auxiliary amplifier of the power amplifier from the shared feedback loop.

8. The method of claim 6, in which the first amplifier of the power amplifier or the auxiliary amplifier of the power amplifier are coupled to the shared feedback loop via a switch, and further comprising controlling operation of the switch via a digital wave generator.

9. The method of claim 8, in which the switch is a binary-weighted switch.

10. The method of claim 8, further comprising configuring the digital wave generator to generate a second order S-shaped wave to control operation of the switch to couple the first amplifier or the auxiliary amplifier to the shared feedback loop.

11. A power amplifier, comprising:

means for switchably coupling a first amplifier of the power amplifier or an auxiliary amplifier of the power amplifier to a shared feedback loop, a first resistance along a first signal path for the first amplifier matching a second resistance along a second signal path for the auxiliary amplifier; and means for ramping an output of the power amplifier from ground to an offset voltage to reduce a pop and/or click.

12. The power amplifier of claim 11, further comprising means for decoupling the first amplifier of the power amplifier or the auxiliary amplifier of the power amplifier from the shared feedback loop.

13. The power amplifier of claim 11, further comprising means for controlling operation of a switch via a digital wave generator.

14. The power amplifier of claim 11, further comprising means for generating a second order S-shaped wave, the means for switchably coupling, coupling the first amplifier of the power amplifier or the auxiliary amplifier of the power amplifier to the shared feedback loop based on the second order S-shaped wave.

* * * * *